(12) United States Patent
Khorram

(10) Patent No.: US 6,999,735 B2
(45) Date of Patent: Feb. 14, 2006

(54) DIGITAL HIGH FREQUENCY POWER DETECTION CIRCUIT

(75) Inventor: Shahla Khorram, Los Angeles, CA (US)

(73) Assignee: Broadcom Corp., Irvine, CA (US)

( * ) Notice: Subject to any disclaimer, the term of this patent is extended or adjusted under 35 U.S.C. 154(b) by 450 days.

(21) Appl. No.: 10/201,130

(22) Filed: Jul. 23, 2002

(65) Prior Publication Data

US 2004/0198284 A1   Oct. 7, 2004

(51) Int. Cl.
*H04B 17/00* (2006.01)
*H03C 1/62* (2006.01)
*G01R 19/00* (2006.01)

(52) U.S. Cl. ............................. 455/115.1; 455/226.1; 327/58

(58) Field of Classification Search ............ 455/115.1, 455/115.3, 115.4, 226.1, 226.2, 226.4; 327/50, 327/58, 62, 560, 563
See application file for complete search history.

(56) References Cited

U.S. PATENT DOCUMENTS

| | | | | |
|---|---|---|---|---|
| 3,882,489 A | * | 5/1975 | Guggolz | ............ 341/132 |
| 5,315,168 A | * | 5/1994 | Norton, Jr. | ................... 327/58 |
| 5,777,507 A | * | 7/1998 | Kaminishi et al. | ......... 327/514 |
| 6,429,696 B1 | * | 8/2002 | Kao et al. | ..................... 327/58 |

\* cited by examiner

*Primary Examiner*—Nguyen T. Vo
(74) *Attorney, Agent, or Firm*—Garlick,Harrison&Markison, LLP; Timothy W. Markison

(57) ABSTRACT

A digital high frequency power detection circuit includes a peak detecting circuit and a peak computing circuit. The peak detecting circuit is operably coupled to detect a peak value of a high frequency signal and includes an amplifier, transistor, and capacitor. The amplifier has a $1^{st}$ input, $2^{nd}$ input and an output, where the $1^{st}$ input is operably coupled to receive the high frequency signal. The transistor has a gate, a drain, and a source, where the gate is coupled to the output of the amplifier, the source is coupled to a supply voltage, and the drain is coupled to the $2^{nd}$ input of the amplifier. The capacitor is operably coupled to the drain of the transistor and to a reference potential. The voltage imposed across the capacitor represents the peak value of the high frequency signal. The peak computing circuit is operably coupled to generate a digital peak value from the peak value.

28 Claims, 6 Drawing Sheets peak detection module 95 peak detection module 95 peak detection module 95

DIGITAL HIGH FREQUENCY POWER DETECTION CIRCUIT

BACKGROUND OF THE INVENTION

1. Technical Field of the Invention

This invention relates generally to communication systems and more particularly to radio frequency transmissions within such systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

To achieve a high performance radio frequency integrated circuit (RFIC), the gain of the low noise amplifier and the gain of the power amplifier need to be accurately set. In addition, the local oscillation needs to be tuned to a desired frequency. To set the low noise amplifier gain, the signal strength of received RF signals is determined via a power detection circuit. The gain of the low noise amplifier is then set based on the received signal strength. In particular, the larger the signal strength the lower the gain and the lower the signal strength the higher the gain. The gain of the power amplifier is set based on transmit power of outgoing radio frequency signals, which is determined by a power detection circuit. The tuning of the local oscillation is based on a peak determination of the local oscillation.

As such, power detection circuits have an important function within high performance RFICs and have been implemented in a variety of ways. For example, the power detection circuit may include two input transistors, a current source and a low pass filter. The input transistors have their gates coupled to receive opposite phases of a differential signal under test. The sources of the transistors and the input to the low pass filter are coupled to the current source, which is also coupled to ground. The drains of the transistors are coupled to a supply voltage via a resistive load. The output of the low pass filter provides the peak value.

The output of low pass filter is then provided to an analog to digital converter to generate a digital peak value. Typically, the analog to digital converter was off-chip, thus the analog peak detection signal was supplied off-chip, converted to a digital signal, and then provided back to the RFIC.

As the operating rates of RFICs push the limits of the integrated circuit fabrication process (e.g., CMOS technology), such power detection circuits are inaccurate for lower amplitude signals. This inaccuracy results because the power detection circuit is slower than the rates of the RFIC.

Therefore, a need exists for a digital high frequency power detection circuit that is accurate at high operating rates, which push the limits of an integrated circuit technology.

BRIEF SUMMARY OF THE INVENTION

The digital high frequency power detection circuit of the present invention substantially meets these needs and others. An embodiment of a digital high frequency power detection circuit includes a peak detecting circuit and a peak computing circuit. The peak detecting circuit is operably coupled to detect a peak value of a high frequency signal and includes an amplifier, transistor, and capacitor. The amplifier has a $1^{st}$ input, $2^{nd}$ input and an output, where the $1^{st}$ input is operably coupled to receive the high frequency signal. The transistor has a gate, a drain, and a source, where the gate is coupled to the output of the amplifier, the source is coupled to a supply voltage, and the drain is coupled to the $2^{nd}$ input of the amplifier. As such, the transistor is providing positive feedback to the amplifier. The capacitor is operably coupled to the drain of the transistor and to a reference potential (e.g., $V_{SS}$, AC ground). The voltage imposed across the capacitor represents the peak value of the high frequency signal. The peak computing circuit is operably coupled to generate a digital peak value from the peak value (i.e., the voltage across the capacitor).

Such a digital high frequency power detection circuit may be implemented on-chip as part of a radio frequency integrated circuit (RFIC). In addition, the digital high frequency power detection circuit operates at speeds equal to or above the operating rates of the RFIC. As such, the digital high frequency power detection circuit provides an accurate representation of peak values of signals. Within the RFIC, the digital high frequency power detection circuit may monitor transmit RF signals for adjusting the gain of a power amplifier, may measure the peak of received RF signals for adjusting the gain of a low noise amplifier, and/or may be used to monitor the peaks of the local oscillation to tune the local oscillator.

DETAILED DESCRIPTION OF THE INVENTION

Figure 1:
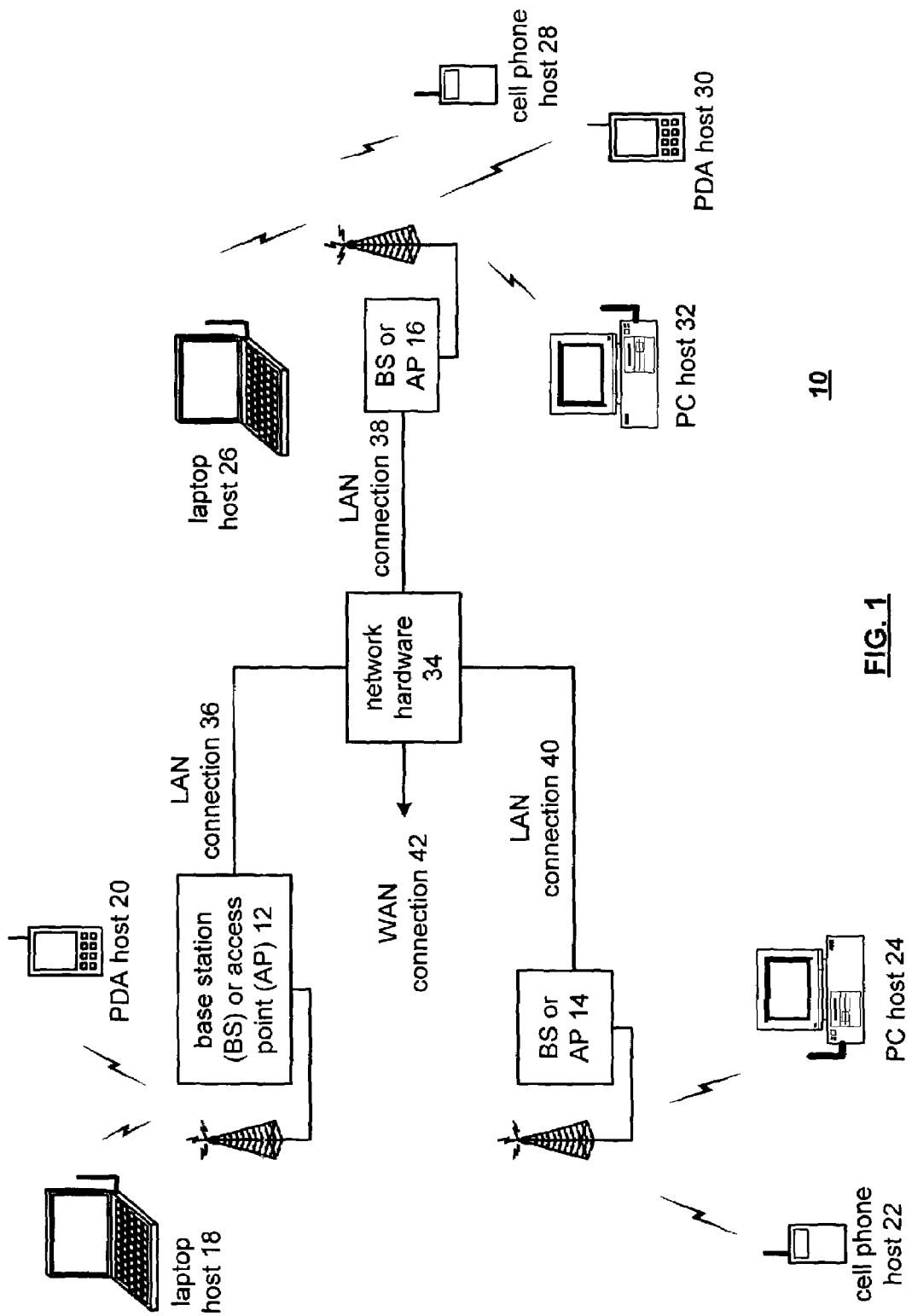
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
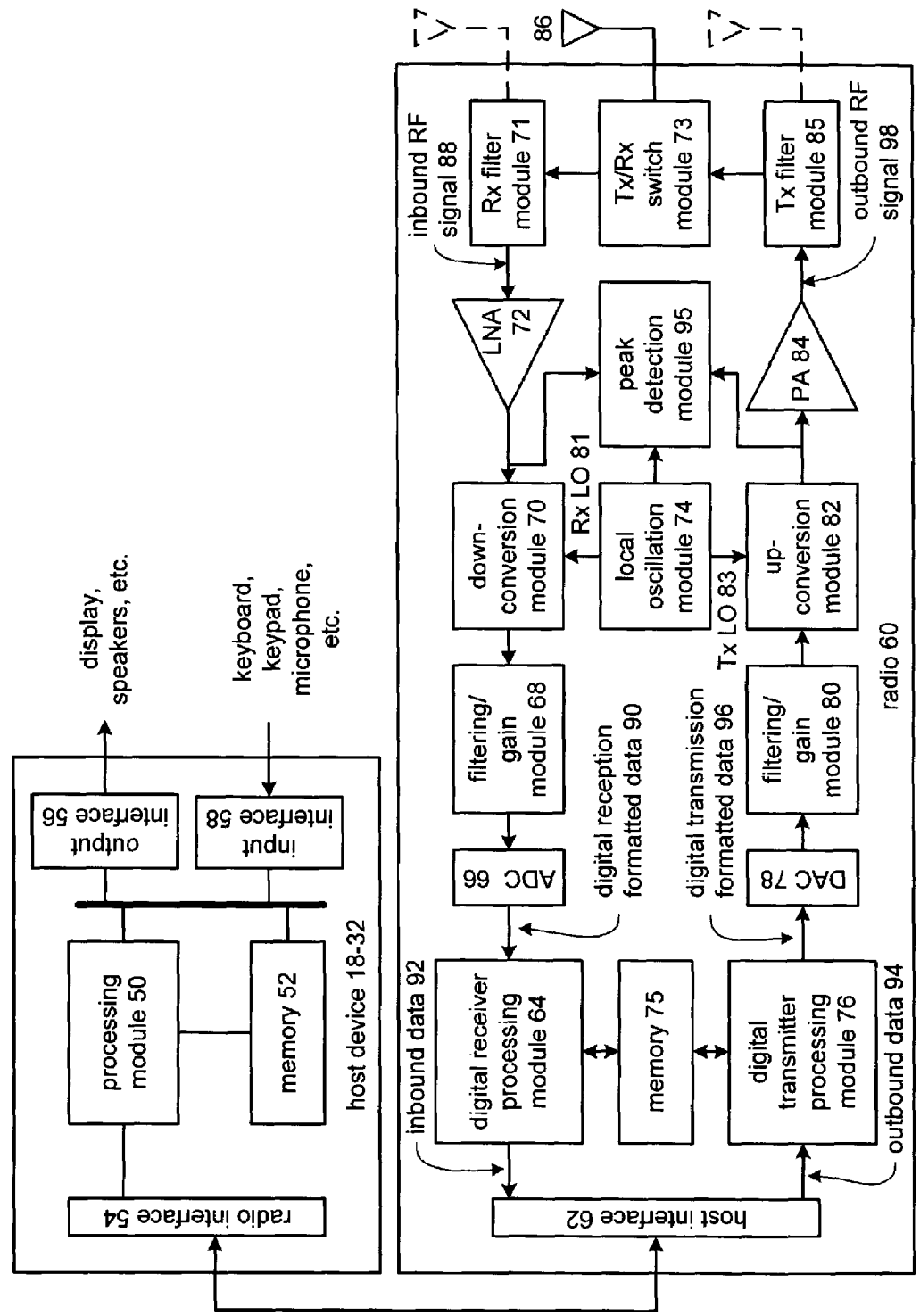
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, a peak detection module 95, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

The peak detection module 95 is operably coupled to monitor one or more of the inbound RF signal 88, the outbound RF signal 98, the receiver local oscillation 81 and the transmitter local oscillation 83. The peak detection module 95, based on a selection signal, will monitor one of these signals and generate a digital peak value corresponding to that signal. For example, if the peak detection module 95 is monitoring the inbound RF signal 88, it generates a peak value corresponding to the inbound RF signal 88. The digital value may be utilized by the digital receiver processing module 64 to adjust the gain of the low noise amplifier 72. Similarly, the peak detection module 95 may monitor the outbound RF signal 98 and generate a digital peak value thereof. The digital peak value may be used by the digital transmitter processing module 76 to adjust the gain of power amplifier 84. Further, the peak detection module 95 may monitor the peaks of local oscillator 81 and/or 83 to generate a digital peak value thereof. The digital peak value may be provided to processing module 64 and/or 76 to fine tune the local oscillations 81 and/or 83 generated by local oscillation module 74. The peak detection module 95 will be discussed in greater detail with reference to FIGS. 3–6.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
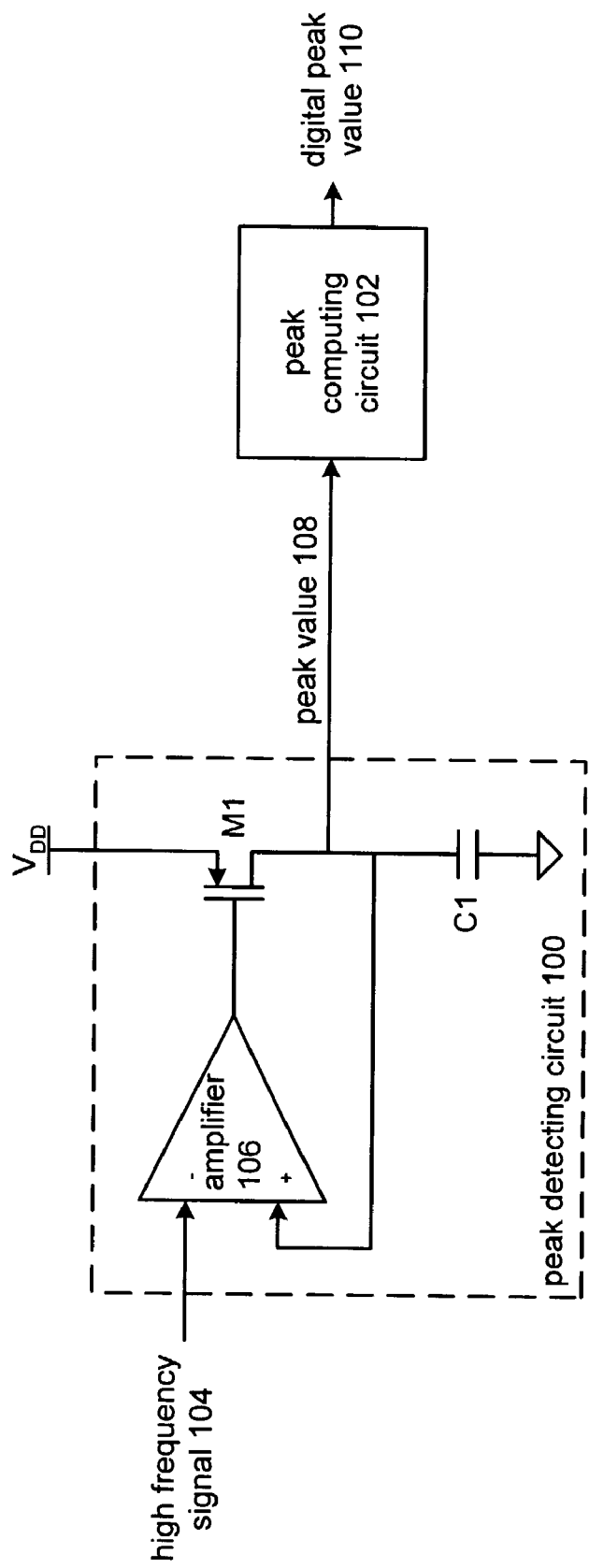
FIG. 3 is a schematic block diagram of a peak detection module in accordance with the present invention.

FIG. 3 is a schematic block diagram of an embodiment of the peak detection module 95 that includes a peak detecting circuit 100 and a peak computing circuit 102. The peak detecting circuit 100 includes an amplifier 106, transistor M1, and capacitor C1. The negative input of amplifier 106 is operably coupled to receive the high frequency signal 104. Depending on the application, the high frequency signal 104 may be the inbound RF signal 88 before or after LNA 72, the outbound RF signal 98 before or after power amplifier 84, the receiver local oscillation 81 or the transmitter local oscillation 83. The output of the amplifier is coupled to the gate of transistor M1 and the source of transistor M1 is coupled to $V_{DD}$. The drain of transistor M1 is coupled to capacitor C1 and fed back to the positive input of amplifier 106. The voltage imposed across capacitor C1 provides the peak value 108, which is an analog signal.

The peak computing circuit 102, converts the peak value 108 from the analog domain to the digital domain. The resulting digital peak value 110 is then provided back to processing module 64 and/or 76.

Figure 4:
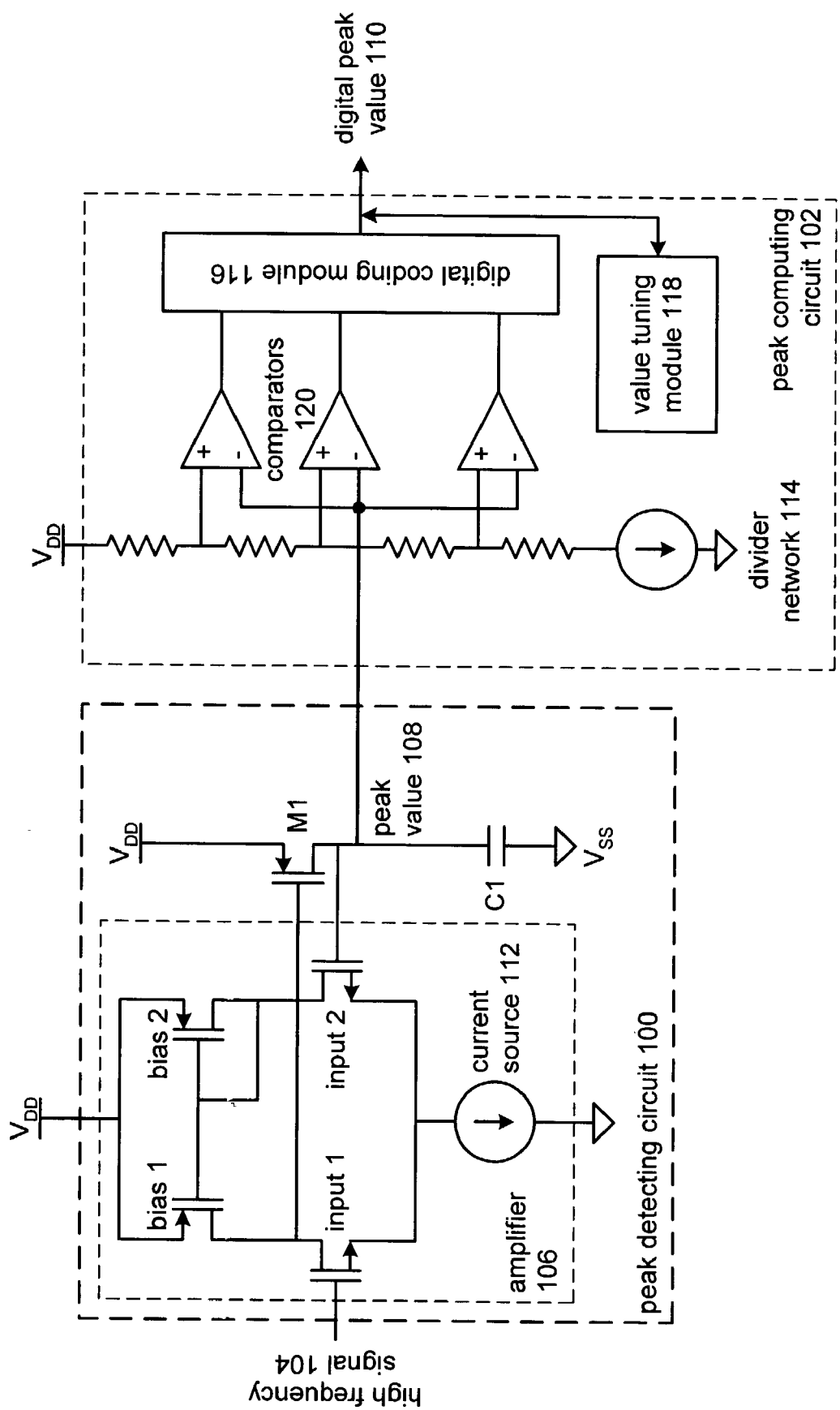
FIG. 4 is a schematic block diagram of an alternate embodiment of a peak detection module in accordance with the present invention.

FIG. 4 illustrates another embodiment of peak detection module 95. In this embodiment, the peak detection module 95 includes the peak detecting circuit 100 and the peak computing circuit 102. The peak detecting circuit 100 includes amplifier 106, transistor M1, and capacitor C1. The amplifier 106 includes two input transistors, two bias transistors and a current source 112. The sizing of the components in the power detection circuit 100 is selected based on the operating frequency of the radio frequency integrated circuit. Accordingly, the capacitor is sized to have a time constant that is comparable or greater than the operating rate of the radio frequency integrated circuit. Accordingly, the current provided by transistor M1 is a determining factor in sizing capacitor C1.

Input transistor 2 of amplifier 106 is operably coupled to receive the high frequency signal 104. Input transistor 2 receives the peak value 108. As coupled, the amplifier 106 provides an output to transistor M1. In operation, as the high frequency signal 104 increases in magnitude, transistor M1 provides a larger current to the capacitor, which charges the capacitor to a higher voltage.

If the high frequency signal 104 is a differential signal, a $3^{rd}$ input transistor may be coupled in parallel with the $1^{st}$ input transistor. The gates of the $1^{st}$ and $3^{rd}$ input transistors receive opposite phases of the differential high frequency signal 104.

The peak computing circuit 102 includes a divider network 114, a plurality of comparators 120, digital coding module 116 and a value tuning module 118. The divider network 114 includes a plurality of resistors and a current source to produce a plurality of reference voltages. The plurality of comparators 120 is coupled to various ones of the reference voltages and to the peak value 108. The digital coding module 116, which may be a thermometer encoder, receives the outputs of comparators 120 and produces a digital peak value 110, therefrom. Accordingly, as the peak value 108 increases, more and more comparator outputs will be low. As such, the digital coding module 116 will receive a combination of low and high values. From these high and low values, the digital peak value 110 is generated. Note than the number of resistors in the divider network 114 establish the number of reference voltages. The more reference voltages, the finer tuned the peak value 108 can be. However, this adds further components to the circuit thus increasing the size as well as power consumption.

The value tuning module 118, which may include a processing module and memory, fine tunes the digital peak value 10. The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory stores, and the processing module executes, operational instructions corresponding to at least some of the steps and/or functions illustrated in FIGS. 5 and 6.

Figure 5:
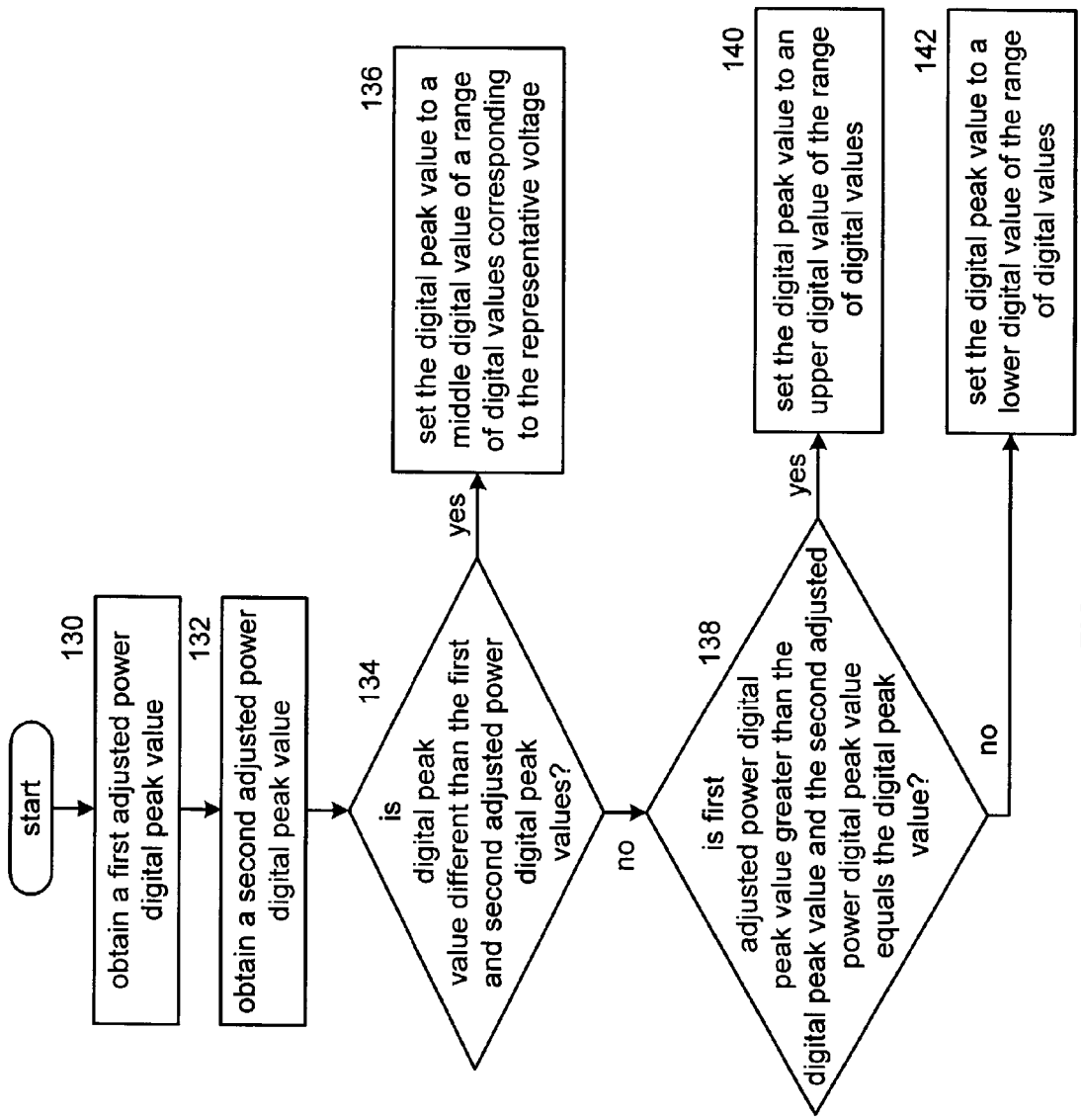
FIG. 5 is a logic diagram of a method for tuning a digital peak value in accordance with the present invention.

FIG. 5 is a logic diagram of a method for fine tuning the digital peak value. The process begins at Step 130 where a $1^{st}$ adjusted digital peak power value is obtained. This value corresponds to the digital peak value of the high frequency signal when the power of the high frequency signal has been increased by a known level. For example, the power may be increased by one decibel. The process then proceeds to Step 132 where a $2^{nd}$ adjusted digital peak power value is obtained. This adjusted power level corresponds to the digital peak value of the high frequency signal when the power of the high frequency signal has been decreased by a known level (e.g., 1 dB).

The process then proceeds to Step 134 where a determination is made as to whether the digital peak value is different than the $1^{st}$ and $2^{nd}$ adjusted power peak values. If yes, the process proceeds to Step 136 where the digital peak value is set to a middle digital value of a range of digital values corresponding to the representative voltage. This will be further described in the illustration of FIG. 6.

If the digital peak value is not different than the $1^{st}$ and $2^{nd}$ adjusted digital peak power values, the process proceeds to Step 138. At Step 138, a determination is made as to whether the $1^{st}$ adjusted digital peak power value is greater than the digital peak value and the $2^{nd}$ adjusted digital peak power value equals the digital peak value. If yes, the process proceeds to Step 140 where the digital peak value is set to an upper digital value of the range of digital values. If not, the $2^{nd}$ adjusted digital peak power value is less than the digital peak value and the $1^{st}$ adjusted digital peak power value equals the digital peak value. In this instance, the process proceeds to Step 142 where the digital peak value is set to a lower digital value of the range of digital values.

Figure 6:
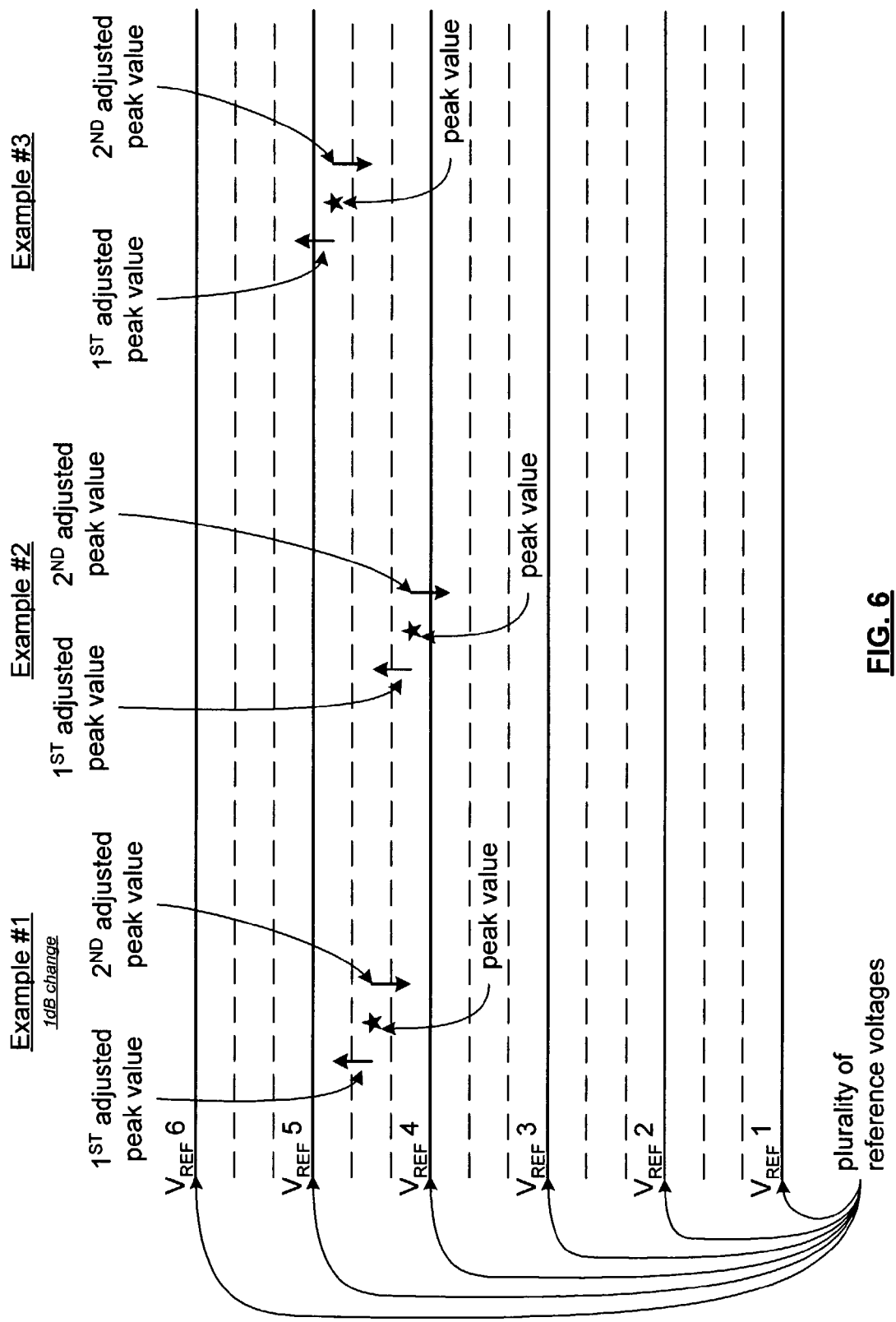
FIG. 6 is a graphical representation of several examples of tuning the digital peak value in accordance with the present invention.

FIG. 6 illustrates three examples of adjusting the digital peak power in accordance with the logic diagram of FIG. 5. The illustration includes a plurality of reference voltages $V_{ref}1$–$V_{ref}6$. These reference values correspond to the reference voltages produced by the divider network. Further, each reference voltage has a corresponding digital power value. The dash lines between each reference voltage corresponds to the range of digital values associated with a digital power value. In this example, the corresponding digital values for $V_{ref}1$–$V_{ref}6$ are in 3 dB steps. The dash lines are at 1 dB steps. Accordingly, each range of digital values includes three digital values. As one of average skill in the art will appreciate, more or less power levels may be used, the spacing between them may be more or less than 3 dB, and the number of digital values in the range may also be more or less than 3.

In example 1, which corresponds to Step 136 of FIG. 5, the digital peak value is approximately centered between $V_{ref}4$ and $V_{ref}5$. When the digital peak value is adjusted up by the 1 dB power increment to produce the $1^{st}$ adjusted peak value, it remains the same digital peak value, i.e., stays between $V_{ref}4$ and $V_{ref}5$. When the digital peak value is adjusted down by the 1 dB power decrement to produce the $2^{nd}$ adjusted peak value, the $2^{nd}$ adjusted peak value also has the same digital value, i.e., stays between $V_{ref}4$ and $V_{ref}5$. As such, since the digital peak value equals both the $1^{st}$ and $2^{nd}$ adjusted peak values, the peak value is set to the middle value of the range of values associated with this digital peak value. For example, if $V_{ref}$ corresponds to 12 dB and $V_{ref}$ corresponds to 15 dB, the range includes 12 dB, 13 dB, and 14 dB, with 13 dB being the middle value. As such, for this example, the peak value will be set to 13 dB.

In example 2, which corresponds to Step 142 of FIG. 5, the digital peak value is close to the $V_{ref}4$ line. Thus, when the digital peak value is adjusted up by the 1 dB power increment, the corresponding $1^{st}$ adjusted peak value has the same digital value as the digital peak value, i.e., stays between $V_{ref}4$ and $V_{ref}5$. When the digital peak value is adjusted down by the 1 dB power decrement, the corresponding $2^{nd}$ adjusted peak value has a different digital peak value since it lies between $V_{ref}3$ and $V_{ref}4$. Thus, with the $1^{st}$ adjusted peak value having the same digital value as the digital peak value and the $2^{nd}$ adjusted peak value having a lower value, the digital peak value is fine tuned to the lower value in the range, which for this example is 12 dB.

Example 3 corresponds to Step 140 of FIG. 5 where the digital peak value is close to $V_{ref}5$. As such, when the $1^{st}$ adjusted peak value is produced by incrementing the power by 1 dB, it has a digital value greater than the digital value of the digital peak value. The $2^{nd}$ adjusted peak value, which corresponds to the 1 dB power decrement, has the same digital value as the digital peak value since it still lies between $V_{ref}4$ and $V_{ref}5$. As such, the digital peak value is adjusted to the upper value in the range, which for this example is 14 dB.

The preceding discussion has presented a digital high frequency power detection circuit that may be used in radio frequency integrated circuits that are pushing the operating limits of the IC fabrication technology. Further, by fine tuning the initial digital peak value, a more accurate digital peak value may be obtained from less precise circuitry. As one of average skill in the art will appreciate, other embodiments may be derived from the teachings of the present invention, without deviating form the scope of the claims.

What is claimed is:

1. A digital high frequency peak detection module comprises:
   peak detecting circuit operably coupled to detect a peak value of a high frequency signal, wherein the peak detecting circuit includes:
      an amplifier having a first input, a second input, and an output, wherein the first input is operably coupled to receive the high frequency signal and wherein the amplifier includes:
         first input transistor having a gate, a drain, and a source, wherein the gate of the first input transistor is operably coupled to receive the high frequency signal;
         first biasing transistor having a gate, a drain, and a source, wherein the drain of the first biasing transistor is coupled to the drain of the first input transistor to provide the output of the amplifier;
         second input transistor having a gate, a drain, and a source, wherein the gate of the second input transistor is operably coupled to receive the peak value of the high frequency signal;
         second biasing transistor having a gate, a drain, and a source, wherein the drain of the second biasing transistor is coupled to the drain of the second input transistor, wherein the gates of the first and second biasing transistors are coupled together and to the drain of the second input transistor, and wherein the sources of the first and second biasing transistors are coupled to the supply voltage; and
         current source operably coupled to the sources of the first and second input transistors and to the reference potential;
      transistor having a gate, a drain, and a source, wherein the gate is coupled to the output of the amplifier, the source is coupled to a supply voltage, and the drain is coupled to the second input of the amplifier, wherein coupling of the transistor provides positive feedback to the amplifier;
      capacitor operably coupled to the drain of the transistor and to a reference potential, wherein a voltage imposed on the capacitor represents the peak value of the high frequency signal; and
   peak computing circuit operably coupled to generate a digital peak value from the peak value.

2. The digital high frequency peak detection module of claim 1, wherein the amplifier further comprises:
   third input transistor having a gate, a drain, and a source, wherein the source of the third input transistor is coupled to the source of the first input transistor and the drain of the third input transistor is coupled to the drain of the first input transistor, wherein the gate of the third input transistor is operably coupled to receive one leg of the high frequency signal.

3. The digital high frequency peak detection module of claim 1, wherein the peak computing circuit further comprises:
   divider network operably coupled to the supply voltage and the reference potential to provide a plurality of reference voltages;
   plurality of comparators operably coupled to compare the peak value with the plurality of reference voltages to produce a representative voltage; and
   digital coding module operably coupled to encode the representative voltage into the digital peak value.

4. The digital high frequency peak detection module of claim 3, wherein the digital coding module further comprises:
   a thermometer coding module.

5. The digital high frequency peak detection module of claim 3, wherein the digital coding module further comprises:
   value tuning module operably coupled to fine tune to the digital peak value by:
   obtaining a first adjusted digital peak power value that corresponds to the digital peak value of the high frequency signal when power of the high frequency signal has been increased by a known level;
   obtaining a second adjusted digital peak power value that corresponds to the digital peak value of the high frequency signal when the power of the high frequency signal has been decreased by the known level;
   analyzing the digital peak value with respect to the first adjusted digital peak power value and the second adjusted digital peak power value, wherein:
      when the first and second adjusted digital peak power values are different than the digital peak value, set the digital peak value to a middle digital value of a range of digital values corresponding to the representative voltage;
      when the first adjusted digital peak power value is greater than the digital peak value and the second adjusted digital peak power value equals the digital peak value, set the digital peak value to an upper digital value of the range of digital values; and
      when the second adjusted digital peak power value is less than the digital peak value and the first adjusted digital peak power value equals the digital peak value, set the digital peak value to a lower digital value of the range of digital values.

6. The digital high frequency peak detection module of claim 3, wherein the digital coding module further comprises:
   value tuning module operably coupled to fine tune to the digital peak value by:
   obtaining a plurality of adjusted digital peak power values that corresponds to the digital peak value of the high frequency signal when power of the high frequency signal has been adjusted by a plurality of known levels;

analyzing the digital peak value with respect to the plurality of adjusted digital peak power values to set the digital peak value to a digital value of a range of digital values that corresponds to the representative voltage.

7. An integrated circuit radio comprises:
transmitter section operably coupled to convert outbound data into outbound radio frequency (RF) signals based on a transmitter local oscillation;
receiver section operably coupled to convert inbound RF signals into inbound data based on a receiver local oscillation;
local oscillation module operably coupled to produce the transmitter local oscillation and the receiver local oscillation; and
peak detection module operably coupled to at least one of the transmitter section, the receiver section, and the local oscillation module, wherein the peak detection module includes:
   peak detecting circuit operably coupled to detect a peak value of a high frequency signal received from the transmitter section, the receiver section, or the local oscillation module, and to generate a digital peak value from the peak value, wherein the peak detecting circuit includes:
      an amplifier having a first input, a second input, and an output, wherein the first input is operably coupled to receive the high frequency signal;
      transistor having a gate, a drain, and a source, wherein the gate is coupled to the output of the amplifier, the source is coupled to a supply voltage, and the drain is coupled to the second input of the amplifier, wherein coupling of the transistor provides positive feedback to the amplifier;
      capacitor operably coupled to the drain of the transistor and to a reference potential, wherein a voltage imposed on the capacitor represents the peak value of the high frequency signal;
      divider network operably coupled to the supply voltage and the reference potential to provide a plurality of reference voltages;
      plurality of comparators operably coupled to compare the peak value with the plurality of reference voltages to produce a representative voltage; and
   digital coding module operably coupled to encode the representative voltage into the digital peak value.

8. The integrated circuit radio of claim 7, wherein the amplifier further comprises:
   first input transistor having a gate, a drain, and a source, wherein the gate of the first input transistor is operably coupled to receive the high frequency signal;
   first biasing transistor having a gate, a drain, and a source, wherein the drain of the first biasing transistor is coupled to the drain of the first input transistor to provide the output of the amplifier;
   second input transistor having a gate, a drain, and a source, wherein the gate of the second input transistor is operably coupled to receive the peak value of the high frequency signal;
   second biasing transistor having a gate, a drain, and a source, wherein the drain of the second biasing transistor is coupled to the drain of the second input transistor, wherein the gates of the first and second biasing transistors are coupled together and to the drain of the second input transistor, and wherein the sources of the first and second biasing transistors are coupled to the supply voltage; and
   current source operably coupled to the sources of the first and second input transistors and to the reference potential.

9. The integrated circuit radio of claim 8, wherein the amplifier further comprises:
   third input transistor having a gate, a drain, and a source, wherein the source of the third input transistor is coupled to the source of the first input transistor and the drain of the third input transistor is coupled to the drain of the first input transistor, wherein the gate of the third input transistor is operably coupled to receive one leg of the high frequency signal.

10. The integrated circuit radio of claim 7, wherein the digital coding module further comprises:
   a thermometer coding module.

11. The integrated circuit radio of claim 7, wherein the peak detection module further comprises:
   peak detection control module operably coupled to select the high frequency signal from the transmitter section, the receiver section, or the local oscillation module and to provide gain adjusts signals to the transmitter section, the receiver section, or the local oscillation module to adjust power of the high frequency signal by a known level;
   and wherein the digital coding module further includes:
      value tuning module operably coupled to fine tune to the digital peak value by:
         obtaining a first adjusted digital peak power value that corresponds to the digital peak value of the high frequency signal when the power of the high frequency signal has been increased by the known level;
         obtaining a second adjusted digital peak power value that corresponds to the digital peak value of the high frequency signal when the power of the high frequency signal has been decreased by the known level;
         analyzing the digital peak value with respect to the first adjusted digital peak power value and the second adjusted digital peak power value, wherein:
            when the first and second adjusted digital peak power values are different than the digital peak value, set the digital peak value to a middle digital value of a range of digital values corresponding to the representative voltage;
            when the first adjusted digital peak power value is greater than the digital peak value and the second adjusted digital peak power value equals the digital peak value, set the digital peak value to an upper digital value of the range of digital values; and
            when the second adjusted digital peak power value is less than the digital peak value and the first adjusted digital peak power value equals the digital peak value, set the digital peak value to a lower digital value of the range of digital values.

12. The integrated circuit radio of claim 7, wherein the peak detection module further comprises:
   peak detection control module operably coupled to select the high frequency signal from the transmitter section, the receiver section, or the local oscillation module and to provide gain adjusts signals to the transmitter section, the receiver section, or the local oscillation module to adjust power of the high frequency signal by a plurality of known levels;
   and wherein the digital coding module further includes:

value tuning module operably coupled to fine tune to the digital peak value by:
  obtaining a plurality of adjusted digital peak power values that corresponds to the digital peak value of the high frequency signal when the power of the high frequency signal has been adjusted by the plurality of known levels;
  analyzing the digital peak value with respect to the plurality of adjusted digital peak power values to set the digital peak value to a digital value of a range of digital values that corresponds to the representative voltage.

13. An integrated circuit transmitter comprises:
up-conversion module operably coupled to convert a low intermediate frequency (IF) signal into radio frequency (RF) signals based on a transmitter local oscillation;
power amplifier operably coupled to amplify the RF signals;
local oscillation module operably coupled to produce the transmitter local oscillation; and
peak detection module operably coupled to at least one of the up-conversion module, the power amplifier, and the local oscillation module, wherein the peak detection module includes:
  peak detecting circuit operably coupled to detect a peak value of a high frequency signal received from the up-conversion module, the power amplifier, or the local oscillation module, wherein the peak detecting circuit includes:
    an amplifier having a first input, a second input, and an output, wherein the first input is operably coupled to receive the high frequency signal and wherein the amplifier includes:
      first input transistor having a gate, a drain, and a source, wherein the gate of the first input transistor is operably coupled to receive the high frequency signal;
      first biasing transistor having a gate, a drain, and a source, wherein the drain of the first biasing transistor is coupled to the drain of the first input transistor to provide the output of the amplifier;
      second input transistor having a gate, a drain, and a source, wherein the gate of the second input transistor is operably coupled to receive the peak value of the high frequency signal;
      second biasing transistor having a gate, a drain, and a source, wherein the drain of the second biasing transistor is coupled to the drain of the second input transistor, wherein the gates of the first and second biasing transistors are coupled together and to the drain of the second input transistor, and wherein the sources of the first and second biasing transistors are coupled to the supply voltage; and
      current source operably coupled to the sources of the first and second input transistors and to the reference potential;
    transistor having a gate, a drain, and a source, wherein the gate is coupled to the output of the amplifier, the source is coupled to a supply voltage, and the drain is coupled to the second input of the amplifier, wherein coupling of the transistor provides positive feedback to the amplifier;
    capacitor operably coupled to the drain of the transistor and to a reference potential, wherein a voltage imposed on the capacitor represents the peak value of the high frequency signal; and
  peak computing circuit operably coupled to generate a digital peak value from the peak value.

14. The integrated circuit transmitter of claim 13, wherein the amplifier further comprises:
  third input transistor having a gate, a drain, and a source, wherein the source of the third input transistor is coupled to the source of the first input transistor and the drain of the third input transistor is coupled to the drain of the first input transistor, wherein the gate of the third input transistor is operably coupled to receive one leg of the high frequency signal.

15. The integrated circuit transmitter of claim 13, wherein the peak computing circuit further comprises:
  divider network operably coupled to the supply voltage and the reference potential to provide a plurality of reference voltages;
  plurality of comparators operably coupled to compare the peak value with the plurality of reference voltages to produce a representative voltage; and
  digital coding module operably coupled to encode the representative voltage into the digital peak value.

16. The integrated circuit transmitter of claim 15, wherein the digital coding module further comprises:
  a thermometer coding module.

17. The integrated circuit transmitter of claim 15, wherein the peak detection module further comprises:
  peak detection control module operably coupled to select the high frequency signal from up-conversion module, the power amplifier, or the local oscillation module and to provide gain adjusts signals to the up-conversion module, the power amplifier, or the local oscillation module to adjust power of the high frequency signal by a known level;
  and wherein the digital coding module further includes:
    value tuning module operably coupled to fine tune to the digital peak value by:
      obtaining a first adjusted digital peak power value that corresponds to the digital peak value of the high frequency signal when the power of the high frequency signal has been increased by the known level;
      obtaining a second adjusted digital peak power value that corresponds to the digital peak value of the high frequency signal when the power of the high frequency signal has been decreased by the known level;
      analyzing the digital peak value with respect to the first adjusted digital peak power value and the second adjusted digital peak power value, wherein:
        when the first and second adjusted digital peak power values are different than the digital peak value, set the digital peak value to a middle digital value of a range of digital values corresponding to the representative voltage;
        when the first adjusted digital peak power value is greater than the digital peak value and the second adjusted digital peak power value equals the digital peak value, set the digital peak value to an upper digital value of the range of digital values; and
        when the second adjusted digital peak power value is less than the digital peak value and the first adjusted digital peak power value equals the digital peak value, set the digital peak value to a lower digital value of the range of digital values.

18. The integrated circuit transmitter of claim 15, wherein the peak detection module further comprises:

peak detection control module operably coupled to select the high frequency signal from up-conversion module, the power amplifier, or the local oscillation module and to provide gain adjusts signals to up-conversion module, the power amplifier, or the local oscillation module to adjust power of the high frequency signal by a plurality of known levels;

and wherein the digital coding module further includes:

value tuning module operably coupled to fine tune to the digital peak value by:

obtaining a plurality of adjusted digital peak power values that corresponds to the digital peak value of the high frequency signal when the power of the high frequency signal has been adjusted by the plurality of known levels;

analyzing the digital peak value with respect to the plurality of adjusted digital peak power values to set the digital peak value to a digital value of a range of digital values that corresponds to the representative voltage.

19. An integrated circuit receiver comprises:

low noise amplifier operably coupled to amplify inbound radio frequency (RF) signals to produce amplified RF signals;

down conversion module operably coupled to convert the amplified RF signals into low intermediate frequency (IF) signals based on a receiver local oscillation;

local oscillation module operably coupled to produce the receiver local oscillation; and peak detection module operably coupled to at least one of the low noise amplifier, the down conversion module, and the local oscillation module, wherein the peak detection module includes:

peak detecting circuit operably coupled to detect a peak value of a high frequency signal received from the low noise amplifier, the down conversion module, or the local oscillation module, wherein the peak detecting circuit includes:

an amplifier having a first input, a second input, and an output, wherein the first input is operably coupled to receive the high frequency signal;

transistor having a gate, a drain, and a source, wherein the gate is coupled to the output of the amplifier, the source is coupled to a supply voltage, and the drain is coupled to the second input of the amplifier, wherein coupling of the transistor provides positive feedback to the amplifier;

capacitor operably coupled to the drain of the transistor and to a reference potential, wherein a voltage imposed on the capacitor represents the peak value of the high frequency signal;

divider network operably coupled to the supply voltage and the reference potential to provide a plurality of reference voltages;

plurality of comparators operably coupled to compare the peak value with the plurality of reference voltages to produce a representative voltage; and digital coding module operably coupled to encode the representative voltage into the digital peak value.

20. The integrated circuit receiver of claim 19, wherein the amplifier further comprises:

first input transistor having a gate, a drain, and a source, wherein the gate of the first input transistor is operably coupled to receive the high frequency signal;

first biasing transistor having a gate, a drain, and a source, wherein the drain of the first biasing transistor is coupled to the drain of the first input transistor to provide the output of the amplifier;

second input transistor having a gate, a drain, and a source, wherein the gate of the second input transistor is operably coupled to receive the peak value of the high frequency signal;

second biasing transistor having a gate, a drain, and a source, wherein the drain of the second biasing transistor is coupled to the drain of the second input transistor, wherein the gates of the first and second biasing transistors are coupled together and to the drain of the second input transistor, and wherein the sources of the first and second biasing transistors are coupled to the supply voltage; and current source operably coupled to the sources of the first and second input transistors and to the reference potential.

21. The integrated circuit receiver of claim 20, wherein the amplifier further comprises:

third input transistor having a gate, a drain, and a source, wherein the source of the third input transistor is coupled to the source of the first input transistor and the drain of the third input transistor is coupled to the drain of the first input transistor, wherein the gate of the third input transistor is operably coupled to receive one leg of the high frequency signal.

22. The integrated circuit receiver of claim 19, wherein the digital coding module further comprises:

a thermometer coding module.

23. The integrated circuit receiver of claim 19, wherein the peak detection module further comprises:

peak detection control module operably coupled to select the high frequency signal from the low noise amplifier, the down conversion module, or the local oscillation module and to provide gain adjusts signals to the low noise amplifier, the down conversion module, or the local oscillation module to adjust power of the high frequency signal by a known level;

and wherein the digital coding module further includes:

value tuning module operably coupled to fine tune to the digital peak value by:

obtaining a first adjusted digital peak power value that corresponds to the digital peak value of the high frequency signal when the power of the high frequency signal has been increased by the known level;

obtaining a second adjusted digital peak power value that corresponds to the digital peak value of the high frequency signal when the power of the high frequency signal has been decreased by the known level;

analyzing the digital peak value with respect to the first adjusted digital peak power value and the second adjusted digital peak power value, wherein:

when the first and second adjusted digital peak power values are different than the digital peak value, set the digital peak value to a middle digital value of a range of digital values corresponding to the representative voltage;

when the first adjusted digital peak power value is greater than the digital peak value and the second adjusted digital peak power value equals the digital peak value, set the digital peak value to an upper digital value of the range of digital values; and when the second adjusted digital peak power value is less than the digital peak value and the first adjusted digital peak power value equals the digital peak value, set the digital peak value to a lower digital value of the range of digital values.

24. The integrated circuit receiver of claim 19, wherein the peak detection module further comprises:
   peak detection control module operably coupled to select the high frequency signal from the low noise amplifier, the down conversion module, or the local oscillation module and to provide gain adjusts signals to the low noise amplifier, the down conversion module, or the local oscillation module to adjust power of the high frequency signal by a plurality of known levels;
   and wherein the digital coding module further includes:
      value tuning module operably coupled to fine tune to the digital peak value by:
         obtaining a plurality of adjusted digital peak power values that corresponds to the digital peak value of the high frequency signal when the power of the high frequency signal has been adjusted by the plurality of known levels;
         analyzing the digital peak value with respect to the plurality of adjusted digital peak power values to set the digital peak value to a digital value of a range of digital values that corresponds to the representative voltage.

25. A digital high frequency peak detection module comprises:
   peak detecting circuit operably coupled to detect a peak value of a high frequency signal, and to generate a digital peak value from the peak value, wherein the peak detecting circuit includes:
      an amplifier having a first input, a second input, and an output, wherein the first input is operably coupled to receive the high frequency signal;
      transistor having a gate, a drain, and a source, wherein the gate is coupled to the output of the amplifier, the source is coupled to a supply voltage, and the drain is coupled to the second input of the amplifier, wherein coupling of the transistor provides positive feedback to the amplifier;
      capacitor operably coupled to the drain of the transistor and to a reference potential, wherein a voltage imposed on the capacitor represents the peak value of the high frequency signal;
      divider network operably coupled to the supply voltage and the reference potential to provide a plurality of reference voltages;
      plurality of comparators operably coupled to compare the peak value with the plurality of reference voltages to produce a representative voltage; and
      digital coding module operably coupled to encode the representative voltage into the digital peak value.

26. The digital high frequency peak detection module of claim 25, wherein the digital coding module further comprises:
   a thermometer coding module.

27. The digital high frequency peak detection module of claim 25, wherein the digital coding module further comprises:
   value tuning module operably coupled to fine tune to the digital peak value by:
      obtaining a first adjusted digital peak power value that corresponds to the digital peak value of the high frequency signal when power of the high frequency signal has been increased by a known level;
      obtaining a second adjusted digital peak power value that corresponds to the digital peak value of the high frequency signal when the power of the high frequency signal has been decreased by the known level;
      analyzing the digital peak value with respect to the first adjusted digital peak power value and the second adjusted digital peak power value, wherein:
         when the first and second adjusted digital peak power values are different than the digital peak value, set the digital peak value to a middle digital value of a range of digital values corresponding to the representative voltage;
         when the first adjusted digital peak power value is greater than the digital peak value and the second adjusted digital peak power value equals the digital peak value, set the digital peak value to an upper digital value of the range of digital values; and
         when the second adjusted digital peak power value is less than the digital peak value and the first adjusted digital peak power value equals the digital peak value, set the digital peak value to a lower digital value of the range of digital values.

28. The digital high frequency peak detection module of claim 25, wherein the digital coding module further comprises:
   value tuning module operably coupled to fine tune to the digital peak value by:
      obtaining a plurality of adjusted digital peak power values that corresponds to the digital peak value of the high frequency signal when power of the high frequency signal has been adjusted by a plurality of known levels;
      analyzing the digital peak value with respect to the plurality of adjusted digital peak power values to set the digital peak value to a digital value of a range of digital values that corresponds to the representative voltage.

* * * * *